US010431306B2

(12) United States Patent
Yasuda et al.

(10) Patent No.: US 10,431,306 B2
(45) Date of Patent: Oct. 1, 2019

(54) RECONFIGURABLE SEMICONDUCTOR INTEGRATED CIRCUIT

(71) Applicant: KABUSHIKI KAISHA TOSHIBA, Minato-ku (JP)

(72) Inventors: Shinichi Yasuda, Setagaya (JP); Masato Oda, Yokohama (JP); Kosuke Tatsumura, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/912,596

(22) Filed: Mar. 6, 2018

(65) Prior Publication Data

US 2019/0043581 A1 Feb. 7, 2019

(30) Foreign Application Priority Data

Aug. 4, 2017 (JP) ................................ 2017-151891

(51) Int. Cl.

*H03K 19/173* (2006.01)
*G11C 14/00* (2006.01)
*G11C 5/06* (2006.01)
*H03K 19/177* (2006.01)
*G11C 11/419* (2006.01)

(Continued)

(52) U.S. Cl.

CPC ............ *G11C 14/0054* (2013.01); *G11C 5/06* (2013.01); *G11C 5/063* (2013.01); *H03K 19/1735* (2013.01); *H03K 19/17728* (2013.01); *G11C 11/417* (2013.01); *G11C 11/419* (2013.01); *G11C 17/165* (2013.01); *H03K 19/1737* (2013.01)

(58) Field of Classification Search

CPC .......... H03K 19/1737; H03K 19/1733; H03K 19/1735

See application file for complete search history.

(56) References Cited

U.S. PATENT DOCUMENTS 6,992,503 B2 * 1/2006 Madurawe .......... G06F 17/5045 326/39
6,995,584 B1 * 2/2006 Nguyen ............. H03K 19/0016 326/47

(Continued)

FOREIGN PATENT DOCUMENTS

JP 2005-303990 10/2005
JP 2009-302254 12/2009

*Primary Examiner* — Son L Mai

(74) *Attorney, Agent, or Firm* — Oblon, McClelland, Maier & Neustadt, L.L.P.

(57) ABSTRACT

A semiconductor integrated circuit according to an embodiment includes: first to third wiring lines; first memory elements disposed in a cross region between the first wiring lines and the second wiring lines; second memory elements disposed in a cross region between the first wiring lines and the third wiring lines; a first write control circuit connected to the first wiring lines: a first circuit connected to one of the second wiring lines and supplying a first potential; a second circuit connected to the other one of the second wiring lines and supplying a second potential lower than the first potential; SRAM cells connected to the third wiring lines; and a selection circuit including input terminals electrically connected to the first wiring lines and an output terminal, the selection circuit connecting one of the input terminals to the output terminal in accordance with an input signal.

12 Claims, 17 Drawing Sheets

(51) Int. Cl.
*G11C 11/417* (2006.01)
*G11C 17/16* (2006.01)

(56) References Cited

U.S. PATENT DOCUMENTS

| | | | | |
|---|---|---|---|---|
| 7,626,861 | B1 * | 12/2009 | Lakkapragada ... | H03K 19/1776<br>326/39 |
| 2005/0190597 | A1 | 9/2005 | Kato | |
| 2014/0254232 | A1 | 9/2014 | Wu | |

* cited by examiner

RECONFIGURABLE SEMICONDUCTOR INTEGRATED CIRCUIT

CROSS REFERENCE TO RELATED APPLICATIONS

This application is based upon and claims the benefit of priority from the prior Japanese Patent Application No. 2017-151891 filed on Aug. 4, 2017, the entire contents of which are incorporated herein by reference.

FIELD

Embodiments described herein relate generally to semiconductor integrated circuits.

BACKGROUND

Reconfigurable semiconductor integrated circuits, such as field programmable gate arrays (hereinafter also referred to as FPGAs), are drawing attention these days. An FPGA obtains basic logical information through logical blocks, and switches connections among the logical blocks with switch blocks. With this configuration, the FPGA can achieve a logical function desired by a user. The logical information about the logical blocks, and the data of the switch blocks for switching connections are stored in a configuration memory, and a desired logical function is achieved in accordance with the stored data. Roughly speaking, configuration memories are used in two kinds of circuits. Specifically, configuration memories are used to store selection information about a multiplexor circuit (hereinafter also referred to as an MUX circuit) for switching wiring connections, and logical information about a lookup table circuit (hereinafter also referred to as an LUT circuit) for achieving a desired logic.

When the information in a configuration memory is made nonvolatile, a nonvolatile FPGA is formed. Since the information is nonvolatile, there is no longer the need to read data from an external memory when the FPGA is activated. Thus, the FPGA can be instantaneously activated, and the power consumption by the FPGA can be reduced through power shutdown conducted while the FPGA is not used.

Meanwhile, a configuration memory used in an LUT circuit can also be used as a small-scale random access memory (RAM). A RAM formed with the LUT circuit (this RAM will be hereinafter also referred to as an LUT-RAM) can access data asynchronously regardless of the clock timing, and handle data. Such an LUT-RAM is characteristically capable of high-speed writing and reading.

However, where the configuration memory in an LUT circuit is made nonvolatile, it takes time to write and erase data in the nonvolatile memory, and therefore, it is difficult to use the configuration memory as an LUT-RAM. Particularly, where a one-time programmable memory such as an anti-fuse device is used as a configuration memory, the configuration memory cannot be used as an LUT-RAM that requires writing and erasing.

DETAILED DESCRIPTION

A semiconductor integrated circuit according to an embodiment includes: first wiring lines; at least two second wiring lines intersecting with the first wiring lines; third wiring lines intersecting with the first wiring lines; first memory elements disposed in a cross region between the first wiring lines and the second wiring lines, at least one of the first memory elements including a first terminal connected to corresponding one of the first wiring lines and a second terminal connected to corresponding one of the second wiring lines; second memory elements disposed in a cross region between the first wiring lines and the third wiring lines, at least one of the second memory elements including a third terminal connected to corresponding one of the first wiring lines and a fourth terminal connected to corresponding one of the third wiring lines; a first write control circuit connected to the first wiring lines: a first circuit connected to one of the second wiring lines, the first circuit supplying a first potential; a second circuit connected to the other one of the second wiring lines, the second circuit supplying a second potential lower than the first potential; SRAM cells disposed to correspond to the third wiring lines, and at least one of the SRAM cells being connected to corresponding one of the third wiring lines; and a selection circuit including input terminals corresponding to the first wiring lines and an output terminal, each of the input terminals being electrically connected to corresponding one of the first wiring lines, the selection circuit connecting one of the input terminals to the output terminal in accordance with an input signal.

The background to the development of embodiments of the present invention is explained below, before the embodiments are described.

Figure 1:
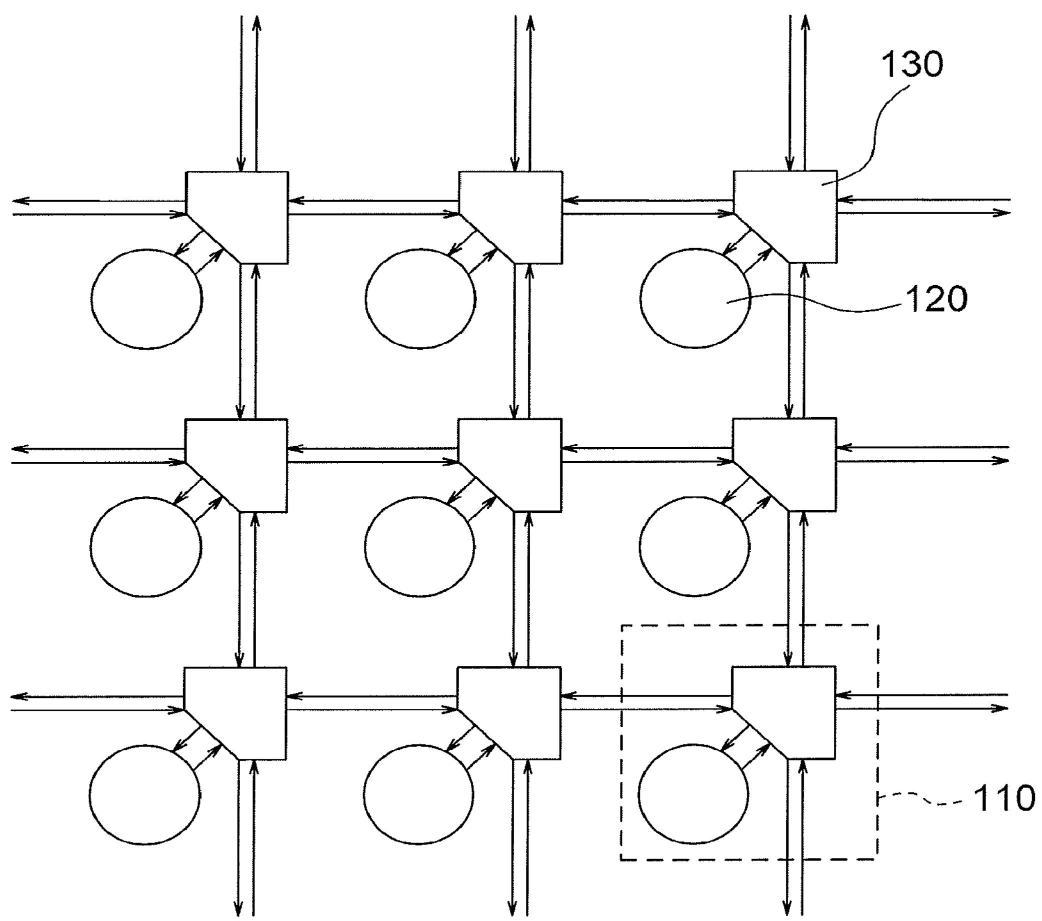
FIG. 1 is a diagram showing the configuration of a conventional FPGA.

First, the structure of a conventional FPGA is described. As shown in FIG. 1, an FPGA 100 normally includes basic blocks 110 arranged in an array. Each basic block 110 is connected to adjacent basic blocks 110 by wiring lines. Each basic block 110 includes a logical block 120 and a switch block 130. Each logical block 120 is a block that performs a logical operation, and its basic configuration is formed with a look-up table (hereinafter also referred to as an LUT) including a truth table. Each switch block 130 controls the connection/disconnection of a wiring line connected to an adjacent basic block 110 and enables transmission of a signal in any direction. Each switch block 130 also connects to the logical block 120 belonging to the basic block 110 including this switch block 130. The logical blocks 120 and the switch blocks 130 can perform connection control in accordance with the data stored in programmable logic circuits, or configuration memories.

Figure 2:
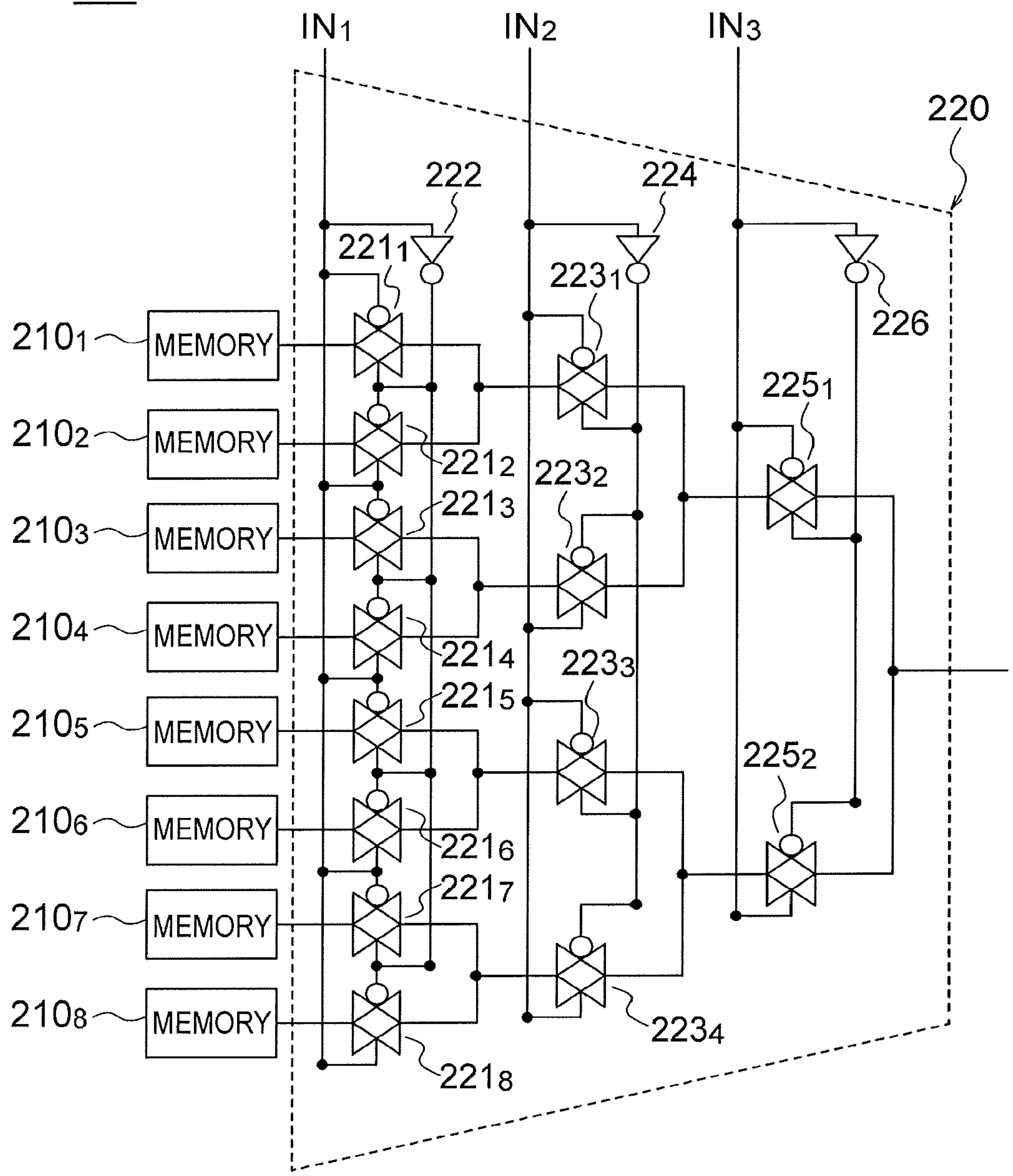
FIG. 2 is a circuit diagram showing an example of an MUX circuit.

FIG. 2 shows an example of the LUT circuit 200 used in a logical block 120. In FIG. 2, the LUT circuit 200 includes three inputs and one output, for example. The LUT circuit 200 includes eight memory cells $\mathbf{210}_1$ through $\mathbf{210}_8$ that store logical values to be output as calculation results, and an MUX circuit 220 that selectively outputs one value from the eight memory cells $\mathbf{210}_1$ through $\mathbf{210}_8$ in accordance with the values of input signals $IN_1$, $IN_2$, and $IN_3$.

The MUX circuit 220 includes eight transfer gates $\mathbf{221}_1$ through $\mathbf{221}_8$ and an inverter 222 arranged in a first stage, four transfer gates $\mathbf{223}_1$ through $\mathbf{223}_4$ and an inverter 224 arranged in a second stage, and two transfer gates $\mathbf{225}_1$ and $\mathbf{225}_2$ and an inverter 226 arranged in a third stage. The inverter 222 receives the input signal $IN_1$ at its input terminal, the inverter 224 receives the input signal $IN_2$ at its input terminal, and the inverter 226 receives the input signal $IN_3$ at its input terminal.

The input terminal of each transfer gate $\mathbf{221}_i$ (i=1, . . . , 8) is connected to the memory cell $\mathbf{210}_i$. In a case where "i" is an odd number, the gate of the p-channel transistor receives the input signal $IN_1$, and the gate of the n-channel transistor receives an output signal from the inverter 222. In a case where "i" is an even number, the gate of the n-channel transistor receives the input signal $IN_1$, and the gate of the p-channel transistor receives the output signal from the inverter 222.

The input terminal of each transfer gate $\mathbf{223}_i$ (i=1, . . . , 4) is connected to the output terminal of the transfer gate $\mathbf{221}_{2i-1}$ and the output terminal of the transfer gate $\mathbf{221}_{2i}$. In a case where "i" is an odd number, the gate of the p-channel transistor receives the input signal $IN_2$, and the gate of the n-channel transistor receives an output signal from the inverter 224. In a case where "i" is an even number, the gate of the n-channel transistor receives the input signal $IN_2$, and the gate of the p-channel transistor receives the output signal from the inverter 224.

The input terminal of each transfer gate $\mathbf{225}_i$ (i=1, 2) is connected to the output terminal of the transfer gate $\mathbf{223}_{2i-1}$ and the output terminal of the transfer gate $\mathbf{223}_{2i}$. For transfer gate $\mathbf{225}_1$, the gate of the p-channel transistor receives the input signal $IN_3$, and the gate of the n-channel transistor receives an output signal from the inverter 226. For transfer gate $\mathbf{225}_2$, the gate of the n-channel transistor receives the input signal $IN_3$, and the gate of the p-channel transistor receives an output signal from the inverter 226. The output terminals of the transfer gates $\mathbf{225}_1$ and $\mathbf{225}_2$ are connected to the output terminal of the MUX circuit 220.

Although FIG. 2 shows an example in which the MUX circuit 220 is formed with a transfer gate, some other component such as a CMOS gate may be used to form the MUX circuit 220. In the memory cells $\mathbf{210}_1$ through $\mathbf{210}_8$, the values of logical operations corresponding to the values of the input signals $IN_1$, $IN_2$, and $IN_3$ are stored. For example, in the case of three inputs, the number of cases is $2^3=8$, and the calculation is performed by storing the respective values in the eight memory cells $\mathbf{210}_1$ through $\mathbf{210}_8$. The MUX circuit 220 shown in FIG. 2 has $2^3$ (=8) input terminals corresponding to the three input signals, and memory cells are connected to the respective input terminals. However, where the number of input signals is n (n≥1), the number of input terminals of the MUX circuit is $2^n$, and memory cells are connected to the respective input terminals.

Figure 3:
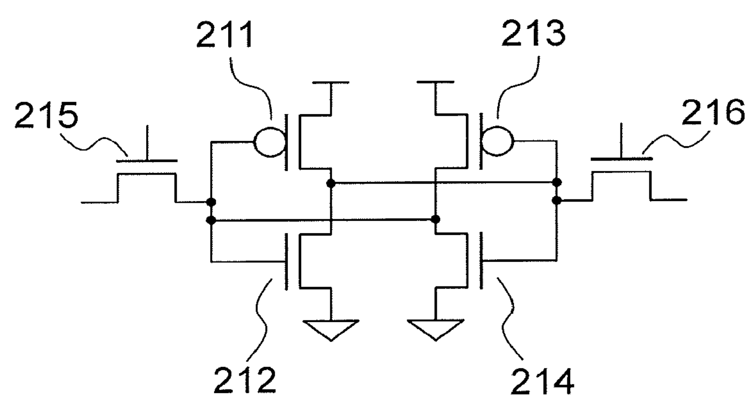
FIG. 3 is a circuit diagram showing an example of an SRAM.

FIG. 3 shows a circuit having the minimum configuration of an SRAM cell normally used as a memory cell 210. The memory cell 210 includes a first inverter including a p-channel transistor 211 and an n-channel transistor 212, a second inverter including a p-channel transistor 213 and an n-channel transistor 214, and n-channel transistors 215 and 216. The input terminal of the first inverter and the output terminal of the second inverter are connected, and the output terminal of the first inverter and the input terminal of the second inverter are connected. That is, the first and second inverters are cross-coupled. The source or the drain of the transistor 215 is connected to the input terminal of the first inverter, and the source or the drain of the transistor 216 is connected to the input terminal of the second inverter.

In a case where the SRAM cell shown in FIG. 3 is used as a memory cell 210, the LUT circuit 200 shown in FIG. 2 can also be used as an LUT-RAM having an 8-bit capacity. In a case where a nonvolatile memory or a one-time memory is used as a memory cell, the FPGA can be made nonvolatile. Thus, power consumption can be advantageously reduced, as the external ROM necessary for activation becomes unnecessary, and the power supply can be shut off during a standby time. However, high-speed writing and reading cannot be performed due to limitations on the program erase time and the number of times of rewriting. Therefore, it is difficult to use the LUT circuit as an LUT-RAM. In view of the above circumstances, the inventors have made intensive studies, to develop a semiconductor integrated circuit that consumes lower amounts of power and is capable of high-speed writing and reading. This semiconductor integrated circuit is described below as an embodiment.

(First Embodiment)

Figure 4:
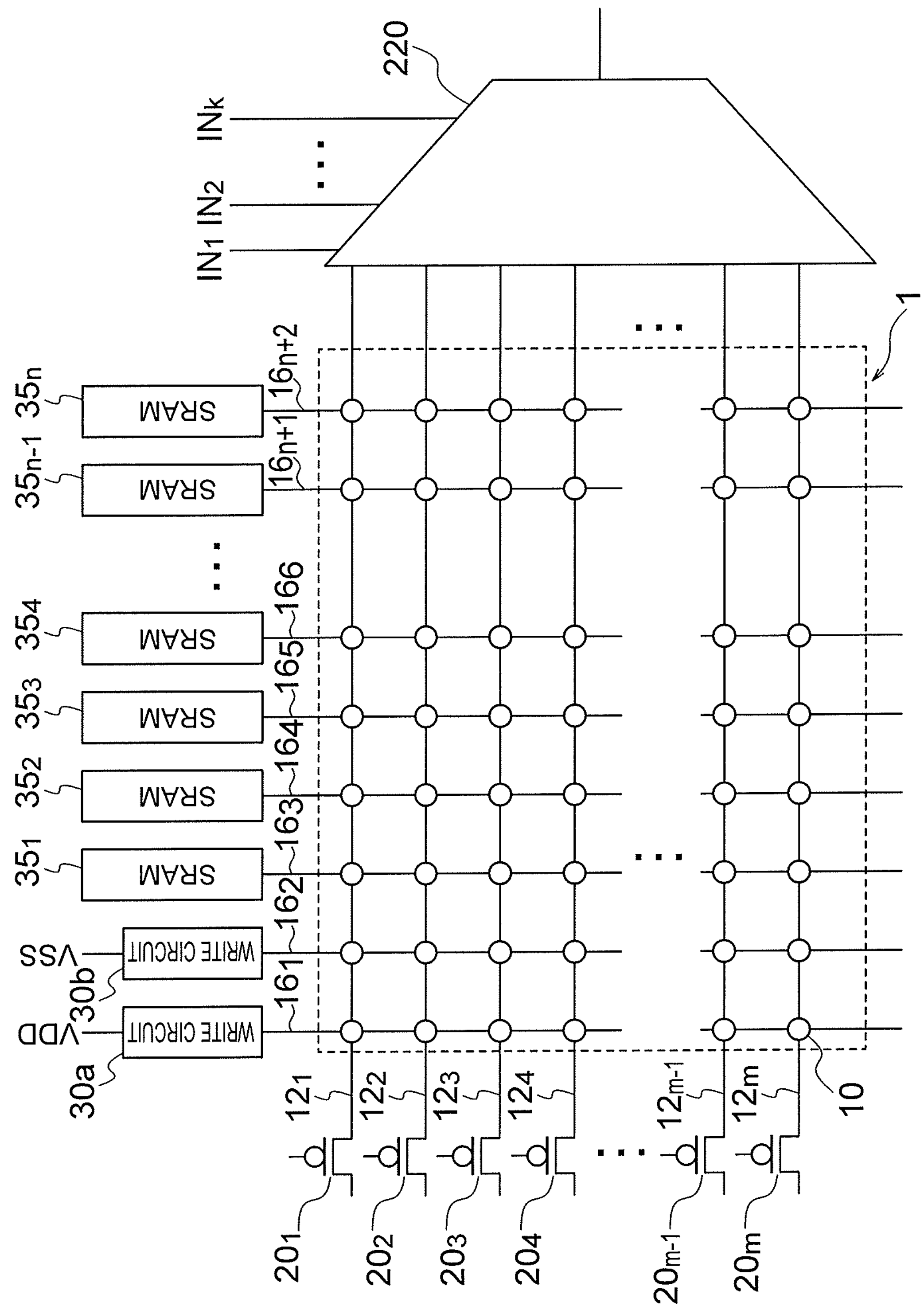
FIG. 4 is a diagram showing a semiconductor integrated circuit according to a first embodiment.

FIG. 4 shows a semiconductor integrated circuit according to a first embodiment. The semiconductor integrated circuit is an LUT circuit, and includes a crossbar array 1 having memory elements 10 arranged in m (m≥2) rows and (n+2) (n≥1) columns, write transistors $\mathbf{20}_1$ through $\mathbf{20}_m$, write circuits 30*a* and 30*b*, SRAM cells $\mathbf{35}_1$ through $\mathbf{35}_n$, and an MUX circuit 220.

The crossbar array 1 further includes row wiring lines $\mathbf{12}_1$ through $\mathbf{12}_m$, and column wiring lines $\mathbf{16}_1$ through $\mathbf{16}_{n+2}$ three-dimensionally intersecting with the row wiring lines $\mathbf{12}_1$ through $\mathbf{12}_m$. Here, "a wiring line A three-dimensionally intersecting with a wiring line B" means that a wiring line A and a wiring B are disposed in levels different from each other, and intersect with each other when viewed from above.

The memory elements 10 are arranged in the cross regions between the row wiring lines $\mathbf{12}_i$ (i=1, . . . m) and the column wiring lines $\mathbf{16}_j$ (j=1, . . . , (n+2)). The memory elements 10 each include a first terminal and a second terminal. The first terminal is connected to the corresponding row wiring line, and the second terminal is connected to the corresponding column wiring line.

One end of each row wiring line $\mathbf{12}_i$ (i=1, . . . , m) is connected to the source or the drain of the corresponding transistor $\mathbf{20}_i$, and the other end is connected to one of the input terminals of the MUX circuit 220. One end of each of the column wiring lines $\mathbf{16}_1$ and $\mathbf{16}_2$ is connected to the corresponding one of the write circuits 30*a* and 30*b*, and one end of each column wiring line $\mathbf{16}_3$ (j=3, . . . , (n+2)) is connected to the corresponding SRAM cell $\mathbf{35}_{j-2}$. The other end of the write circuit 30*a* is connected to a power supply voltage VDD, and the other end of the write circuit 30*b* is connected to a ground power supply VSS.

The MUX circuit 220 selects one of the input terminals in accordance with input signals $IN_1$ through $IN_k$ (k≥1), and, through the output terminal, outputs the signal input to the selected input terminal. That is, the MUX circuit 220 is a selection circuit that connects one of the input terminals to the output terminal in accordance with the input signals $IN_1$ through $IN_k$ (k≥1).

The steady state of each memory element 10 is a high-resistance state (OFF-state). When writing is performed on one of the memory elements 10 connected to one row wiring line, the memory elements 10 connected to the one row wiring line enter a low-resistance state (ON-state).

In a case where a write voltage is applied from the row direction, each transistor $\mathbf{20}_i$ (i=1, . . . , m) is a p-channel MOS transistor, for example. In a case where the write voltage of a memory element is higher than the power supply voltage VDD of the logic circuit, the p-channel transistor is preferably a high-voltage transistor having a great gate insulating film thickness, for reliability reasons. The write transistors $\mathbf{20}_1$ through $\mathbf{20}_m$ constitute a write row control circuit for the crossbar array 1.

In a case where the number of input signals from which one input signal is to be selected by the MUX circuit 220, or the number of input signals of the LUT, is k, the number m of the row wiring lines $\mathbf{12}_1$ through $\mathbf{12}_m$ is basically $2^k$. In this case, the minimum number of the column wiring lines $\mathbf{16}_1$ through $\mathbf{16}_{n+2}$ is $2+2^k$, and the column wiring lines $\mathbf{16}_1$ through $\mathbf{16}_{n+2}$ are connected to $2^k$ SRAM cells $\mathbf{35}_1$ through $\mathbf{35}_n$ and the write circuits 30*a* and 30*b*. However, in a case where the SRAM cells are made to have redundancy, or where the value of one SRAM cell is used for input terminals of the MUX circuit 220, the number m of the row wiring lines $\mathbf{12}_1$ through $\mathbf{12}_m$ and the number n of SRAM cells may change from $2^k$. The crossbar array 1 using the two-terminal memory elements 10 has a much smaller area than multiplexors formed with CMOS transistors. Therefore, the crossbar array 1 is beneficial in forming the LUT circuit of this embodiment. In FIG. 4, the write circuits 30*a* and 30*b* are connected to the column wiring lines $\mathbf{16}_1$ and $\mathbf{16}_2$, respectively. However, the write circuits 30*a* and 30*b* may be connected to any of the column wiring lines $\mathbf{16}_3$ through $\mathbf{16}_{n+2}$. For example, the write circuit 30*a* may be connected to the column wiring line $\mathbf{16}_2$, and the write circuit 30*b* may be connected to the column wiring line $\mathbf{16}_4$. In this case, the SRAM cell $\mathbf{35}_1$ is connected to the column wiring line $\mathbf{16}_1$, the SRAM cell $\mathbf{35}_2$ is connected to the column wiring line $\mathbf{16}_3$, and the SRAM cells $\mathbf{35}_3$ through $\mathbf{35}_n$ are connected to the column wiring lines $\mathbf{16}_4$ to $\mathbf{16}_{n+2}$, for example.

(Memory Elements)

Figure 5A:
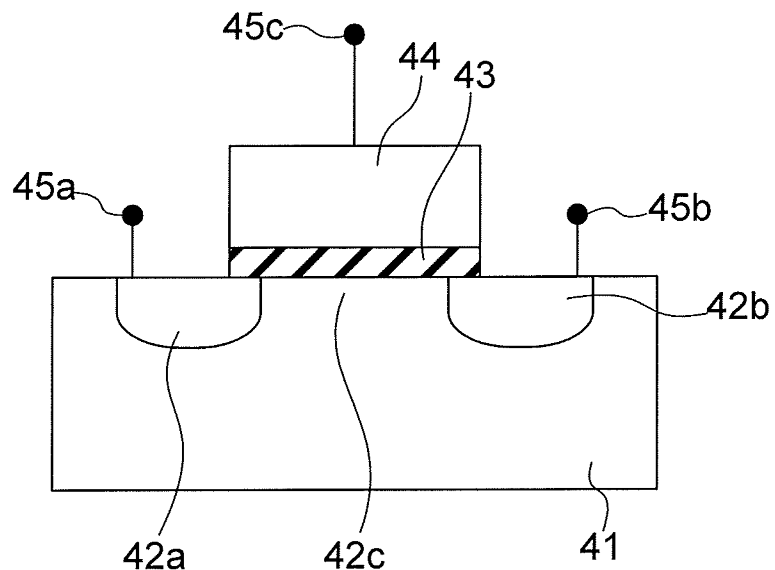
FIGS. 5A and 5B are diagrams each showing a specific example of a memory element.

FIG. 5A shows a first specific example of a two-terminal memory element 10. The memory element 10 of the first specific example uses gate breakdown of a MOS transistor, and is a one-time programmable (OTP) memory. The MOS transistor includes a source 42*a* and a drain 42*b* disposed at a distance from each other in a semiconductor layer 41, a gate insulating layer 43 disposed on a region of the semiconductor layer 41 that serves as a channel 42*c* between the source 42*a* and the drain 42*b*, a gate electrode 44 (also referred to as the gate 44) disposed on the gate insulating layer 43, a terminal 45*a* connected to the source 42*a*, a terminal 45*b* connected to the drain 42*b*, and a terminal 45*c* connected to the gate 44.

In the memory element 10 in a normal state, the gate insulating layer 43 exists between the gate 44 and the source 42*a*, and between the gate 44 and the drain 42*b*. This state is a high-resistance state. At the time of writing, a write voltage Vprog is applied between the terminal 45*c* and the terminal 45*a*, and between the terminal 45*c* and the terminal 45*b*, to break the gate insulating layer 43. In this manner, conduction is achieved between the gate 44 and either the source 42*a* or the drain 42*b*. Here, at the time of writing, both the terminals 45*a* and 45*b* are connected to a power supply, but a power supply may be connected to one of the terminals 45*a* and 45*b*. Further, in a case where the write voltage Vprog is applied, a high voltage may be applied to the gate 44, or may be applied to the source 42*a* or the drain 42*b*. However, in a case where a high voltage is applied to the source 42*a* or the drain 42*b*, leakage to the semiconductor layer 41 might occur, or the junction between the source 42*a* and the semiconductor layer 41 or the junction between the drain 42*b* and the semiconductor layer 41 might break down. Therefore, it is preferable to apply a high voltage to the gate 44, or the terminal 45*c*. That is, in the LUT circuit shown in FIG. 4, it is preferable to connect the gate 44 to a row wiring line.

Figure 5B:
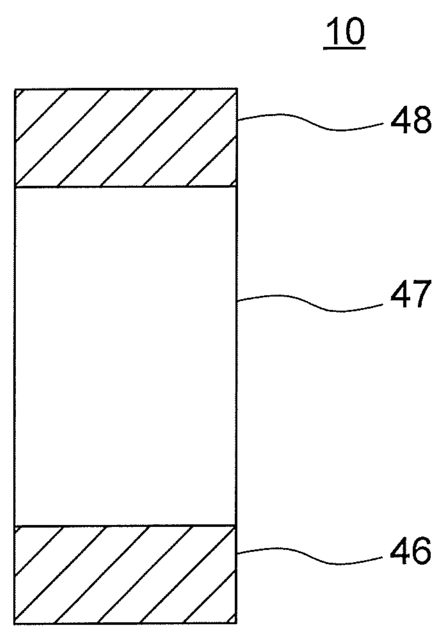

FIG. 5B shows a second specific example of a memory element 10. The memory element 10 of the second specific example is a resistive change memory element that can be formed in a CMOS wiring layer, and has a structure in which a resistive change layer 47 is interposed between a lower electrode 46 and an upper electrode 48. The upper electrode 48 and the lower electrode 46 are made of a single metal selected from the group consisting of Ti, TiN, Ta, TaN, Al, Cu, Ni, Au, Ag, doped Si, poly Si, and amorphous Si, an alloy of these metals, or a compound of these metals, for example. The upper electrode 48 and the lower electrode 46 may be made of the same material, or may be made of different materials from each other. The resistive change layer 47 is normally made of an insulator, such as $SiO_2$, $TiO_2$, $Ta_2O_5$, $HfO_2$, $ZrO_2$, or $Al_2O_3$, or a film stack formed with these materials. The resistive change layer 47 forms or eliminates a conductive filament in the resistive change layer by applying a voltage or a current between the lower electrode 46 and the upper electrode 48. In this manner, the resistive change layer 47 causes a resistance change. There are two types of resistive change memory elements: a bipolar type in which switching between an ON-state and an OFF-state is performed by adjusting the voltage direction, and a unipolar type in which the voltage direction is constant, but the value of the voltage is changed. The description of this embodiment is based mainly on the unipolar type. Circuits compatible with the bipolar type will be described later.

(Write Circuits)

Figure 6A:
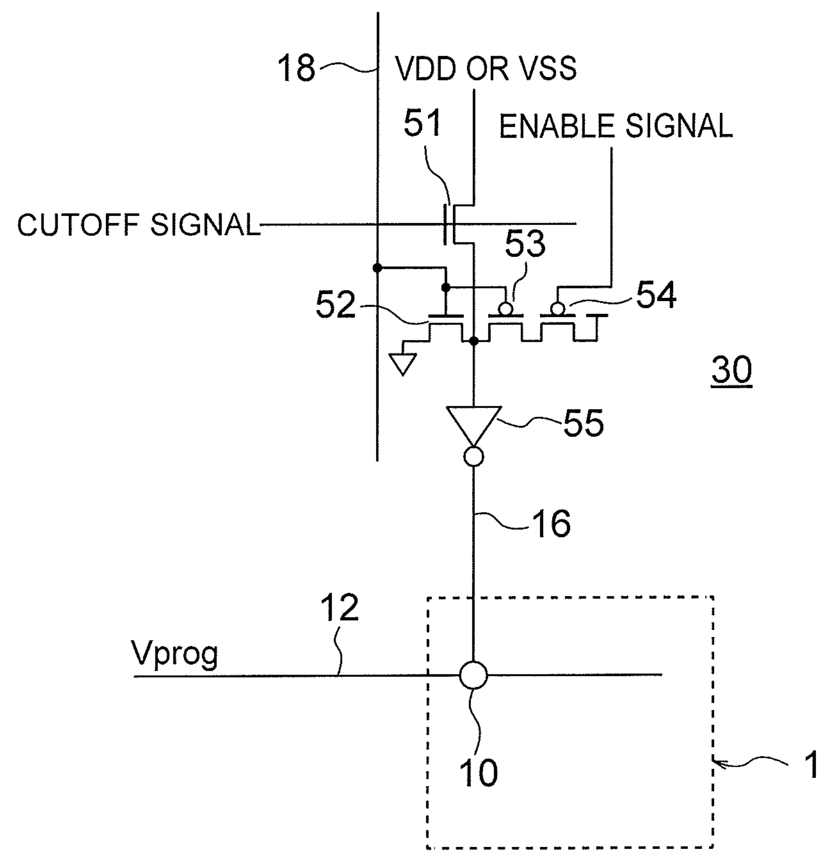
FIGS. 6A and 6B are diagrams each showing a specific example of a write circuit.

FIG. 6A shows a first specific example of the write circuits 30*a* and 30*b*. A write circuit 30 of the first specific example includes a cutoff transistor 51, an n-channel transistor 52, p-channel transistors 53 and 54, and an inverter 55. One of the source and the drain of the cutoff transistor 51 is connected to the power supply VDD or the ground power supply VSS, the other one of the source and the drain is connected to the input terminal of the inverter 55, and the gate receives a cutoff signal. When the cutoff transistor 51 is connected to the power supply VDD, a p-channel transistor may be used. When the cutoff transistor 51 is connected to the ground power supply VSS, an n-channel transistor may be used. Here, the one of the source and the drain of the cutoff transistor 51 serves as the input terminal of the write circuit 30. That is, the input terminal of the write circuit 30 is connected to the power supply VDD or the ground power supply VSS.

The transistors 54, 53, and 52 form a series circuit connected in series. One end of the series circuit is connected to the power supply VDD, and the other end is connected to the ground power supply VSS. The transistor 54 receives an enable signal at its gate. The transistors 53 and 52 form an inverter. The input terminal of the inverter is connected to a column selection line 18 that selects the write circuit 30*a* or the write circuit 30*b*, and the output terminal is connected to the input terminal of the inverter 55. The output terminal of the inverter 55 is connected to the column wiring line 16 corresponding to the write circuit 30. A memory element 10 is disposed in the cross region between a row wiring line 12 and the column wiring line 16.

Next, operation of the write circuit 30 of the first specific example is described. In a normal operation, a voltage for turning on the transistor 51 is applied to the cutoff signal, a power supply potential VDD or a ground potential VSS is applied to the input terminal of the write circuit 30, and the signal inverted by the inverter 55 is supplied to the column wiring line 16 of the crossbar array 1.

When writing is performed on a memory element 10, a signal for turning off the transistor 51 is applied to the cutoff signal, and the ground potential VSS is applied to the enable signal or the transistor 54 to be connected is turned on. In a case where the ground potential VSS is applied to the column selection line 18, the ground potential VSS is output to the column wiring line 16 of the crossbar array 1, and the potential difference (=Vprog−VSS) between the write potential Vprog applied to the row wiring line 12 and the ground potential VSS is supplied to the memory element 10. Writing is then performed on the memory element 10. In a case where the power supply potential VDD is applied to the column selection line 18, the power supply potential VDD is output to the column wiring line 16 of the crossbar array 1, but the write potential Vprog is set so that the potential difference Vprog-VDD applied to the memory element 10 remains lower than the write voltage of the memory element 10. In this manner, writing on the memory element 10 can be protected.

Figure 6B:
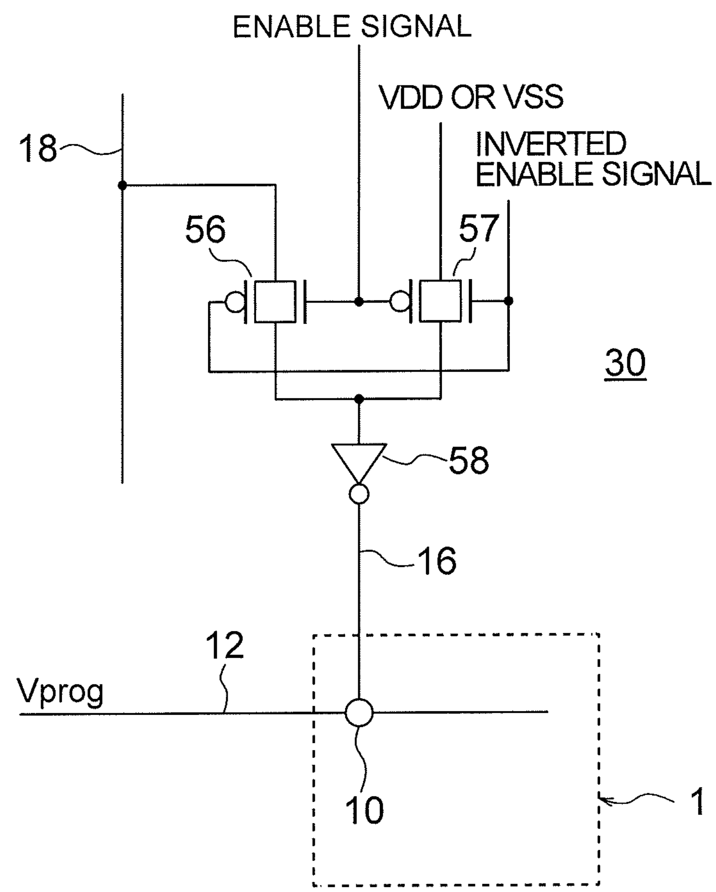

FIG. 6B shows a write circuit 30 of a second specific example. The write circuit 30 of the second specific example includes transfer gates 56 and 57, and an inverter 58. The input terminal of the transfer gate 56 is connected to the column selection line 18, and the output terminal is connected to the input terminal of the inverter 58. The input terminal of the transfer gate 57 is connected to the power supply VDD or the ground power supply VSS, and the output terminal is connected to the input terminal of the inverter 58. An enable signal is input to the gate of the n-channel transistor of the transfer gate 56 and the gate of the p-channel transistor of the transfer gate 57, and an inverted enable signal generated by inverting the enable signal is input to the gate of the p-channel transistor of the transfer gate 56 and the gate of the n-channel transistor of the transfer gate 57. The output terminal of the inverter 58 is connected to the column wiring line 16 corresponding to the write circuit 30. A memory element 10 is disposed in the cross region between a row wiring line 12 and the column wiring line 16.

Next, operation of the write circuit 30 of the second specific example is described. In a normal operation, the enable signal is set to the ground potential VSS, and the inverted enable signal is set to the power supply potential VDD. With this arrangement, the power supply potential VDD or the ground potential VSS is selected, and the signal inverted by the inverter 58 is supplied to the column wiring line 16 of the crossbar array 1.

When writing is performed on the memory element 10, the enable signal is set to the power supply potential VDD, and the inverted enable signal is set to the ground potential VSS. With this arrangement, the signal of the column selection line 18 is selected. In a case where the column selection line 18 has the power supply potential VDD, the ground potential VSS is output to the column wiring line 16 of the crossbar array 1, and the difference (=Vprog−VSS) between the write potential Vprog and the ground potential VSS is applied to the memory element 10. Thus, writing is performed on the memory element 10. In a case where the ground potential VSS is applied to the column selection line 18, the power supply potential VDD is output to the crossbar array 1 via the column wiring line 16. However, the write potential Vprog is set so that the potential difference Vprog-VDD remains lower than the write voltage of the memory element 10. In this manner, writing on the memory element 10 is prevented.

In the write circuits 30 of the first and second specific examples shown in FIGS. 6A and 6B, the resistance value of the memory element 10 in the ON-state after writing depends on the amount of current that can be applied by the n-channel transistors forming the inverters 55 and 58. Since a lower resistance value in the ON-state is more beneficial in delaying a signal in an FPGA operation, a greater channel width for the transistors forming the inverters 55 and 58 is more beneficial in delaying an FPGA operation. At this point, if it is difficult to drive the inverters 55 and 58 with the power supply potential VDD or the ground potential VSS or the signal of the column selection line, inverters having different transistor channel widths should be connected in multiple stages to solve the situation.

Further, if outputting of signals generated by inverting the signals of the power supply potential VDD and the ground potential VSS causes confusion, the number of inverters 55 and 58 should be made an even number to solve the situation. It should be noted that FIGS. 6A and 6B show specific examples of circuit configurations, and the present invention is not limited to these configurations. For example, the p-channel transistor and the n-channel transistor may be replaced with each other, to switch the roles of the power supply VDD and the ground power supply VSS of each signal line. In this manner, the same effects as above can be achieved.

(Write Operation)

Figure 7:
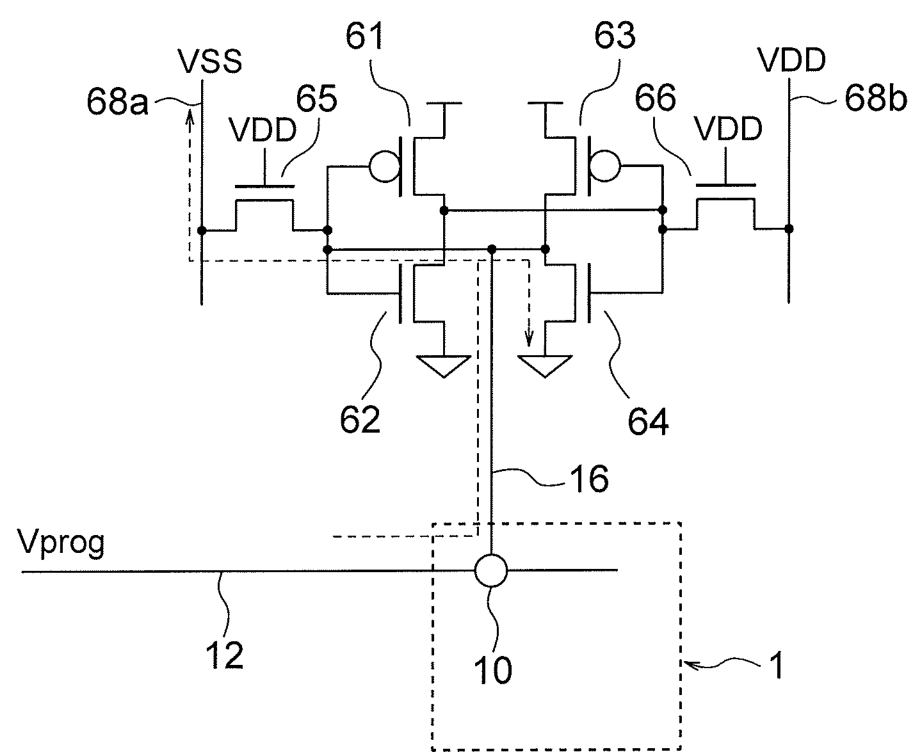
FIG. 7 is a diagram for explaining writing on a memory element in the semiconductor integrated circuit of the first embodiment.

Referring now to FIG. 7, a write operation to be performed by the semiconductor integrated circuit of the first embodiment is described.

FIG. 7 is a diagram for explaining a write operation of the memory element 10 connected to an SRAM cell 35. The SRAM cell 35 includes a first inverter including a p-channel transistor 61 and an n-channel transistor 62, a second inverter including a p-channel transistor 63 and an n-channel transistor 64, and n-channel transistors 65 and 66. The input terminal of the first inverter and the output terminal of the second inverter are connected, and the output terminal of the first inverter and the input terminal of the second inverter are connected. That is, the first and second inverters are cross-coupled. One of the source and the drain of the transistor 65 is connected to the input terminal of the first inverter, and one of the source and the drain of the transistor 66 is connected to the input terminal of the second inverter. The gates of the transistors 65 and 66 are connected to a word line. The other one of the source and the drain of the transistor 65 is connected to a bit line 68*a*, and the other one of the source and the drain of the transistor 66 is connected to a bit line 68*b*.

When writing is performed on the memory element 10, the column wiring line 16 of the crossbar array 1 to which the SRAM cell 35 is connected is set to the ground potential VSS. This is conducted in the following manner. The power supply potential VDD is applied to the word line to which the SRAM cell 35 is connected, to turn on the transistors 65 and 66 so that one of the bit lines 68*a* and 68*b* connected to the SRAM cell 35, or the bit line 68*a*, for example, is set to the ground potential VSS while the other bit line 68*b* is set to the power supply potential VDD. As a result, the ground potential VSS is output to the column wiring line 16 of the crossbar array 1, and the write potential Vprog is applied to the row wiring line 12, so that the potential difference (=Vprog−VSS) is applied to the memory element 10, and the write current indicated by dashed arrows in FIG. 7 flows. Thus, writing is performed on the memory element 10.

In each memory element 10 on which writing is not to be performed, on the other hand, the column wiring line 16 to which this memory element 10 is connected, or the column wiring line 16 of the crossbar array 1 to which the SRAM cell 35 is connected, is set to the power supply potential VDD. This is conducted in the following manner. The power supply potential VDD is applied to the word line to which the SRAM cell 35 is connected, to turn on the transistors 65 and 66 so that one of the bit lines 68*a* and 68*b* connected to the SRAM cell 35, or the bit line 68*a*, for example, is set to the power supply potential VDD while the other bit line 68*b* is set to the ground potential VSS.

As the column wiring line 16 to which the memory element 10 is connected is set to the power supply potential in the above manner, a potential difference Vprog-VDD is applied between the first terminal and the second terminal of the memory element 10. At this point of time, the write potential Vprog is set so that the potential difference remains lower than the write voltage of the memory element 10. In this manner, writing on the memory element 10 can be prevented. Since the current during writing flows through the n-channel transistor 62 or 64 forming an inverter and the n-channel transistor 65 or 66 having its gate connected to the word line, the resistance value in the ON-state after the writing depends on the amount of the write current that flows in these n-channel transistors.

(Nonvolatile LUT Operation)

Figure 8:
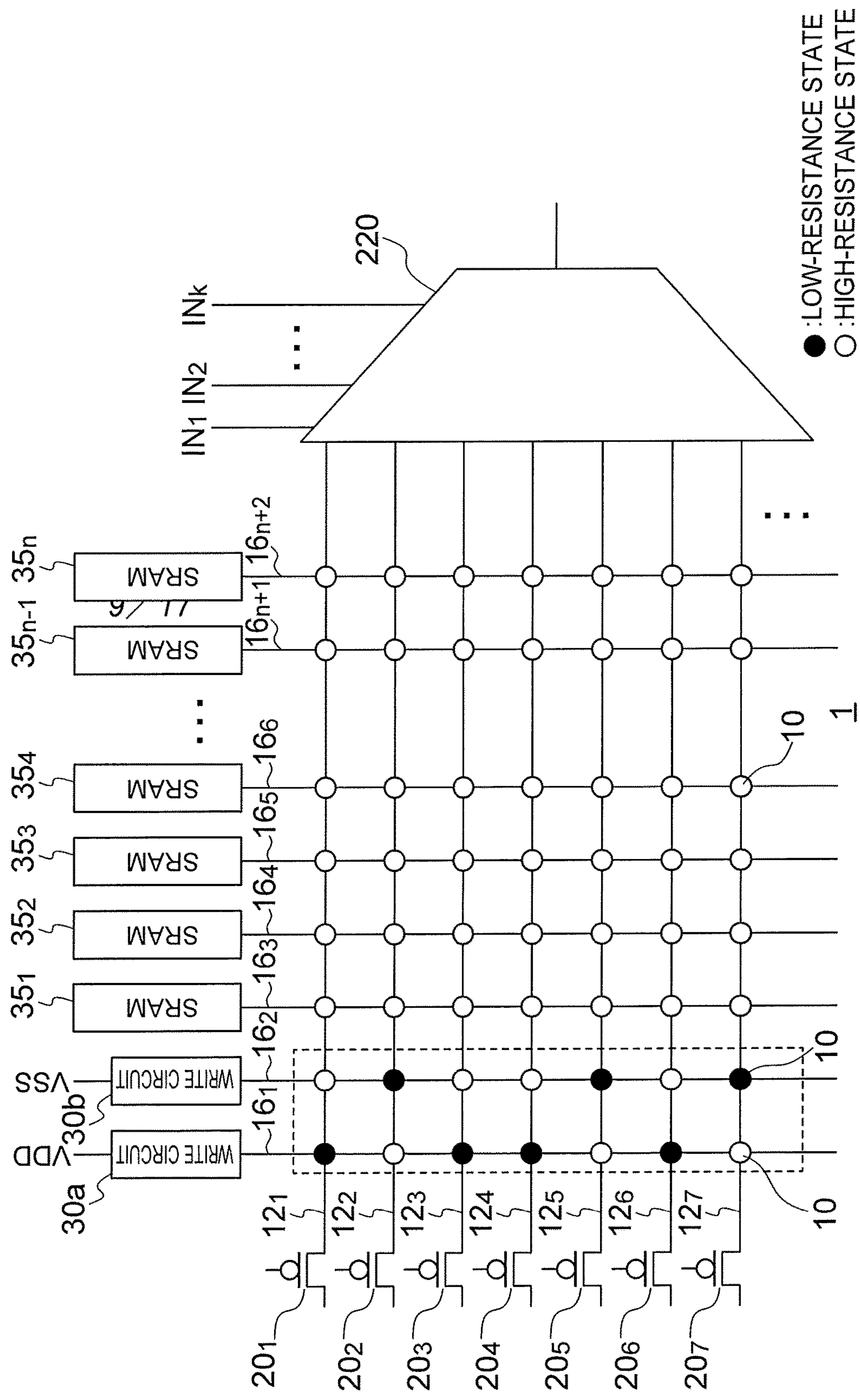
FIG. 8 is a diagram for explaining a nonvolatile LUT operation in the first embodiment.

Referring now to FIG. 8, an operation to be performed in a case where the semiconductor integrated circuit (LUT circuit) of the first embodiment is used as a nonvolatile LUT is described.

In a case where the LUT circuit of this embodiment is used as a nonvolatile LUT, writing is performed on memory elements 10 whose the second terminals connected to the column wiring lines to which the write circuits 30*a* and 30*b* are connected, which are the column wiring lines $\mathbf{16}_1$ and $\mathbf{16}_2$, for example. On each row wiring line $\mathbf{12}_i$ (i=1, . . . ) in this case, writing is performed on the memory element 10 connected to one of the column wiring lines $\mathbf{16}_1$ and $\mathbf{16}_2$, but writing is not performed on the memory element 10 connected to the other one of the column wiring lines $\mathbf{16}_1$ and $\mathbf{16}_2$. For example, as shown in FIG. 8, on the row wiring line $\mathbf{12}_1$, writing is performed on the memory element 10 connected to the column wiring line $\mathbf{16}_1$, so that this memory element 10 is put into a low-resistance state. However, writing is not performed on the memory element 10 connected to the column wiring line $\mathbf{16}_2$, so that this memory element 10 is put into a high-resistance state. In FIG. 8, the memory elements 10 in a low-resistance state are represented by black circles, and the memory elements 10 in a high-resistance state are represented by white circles.

With this configuration, a fixed potential such as VDD or VSS can be applied to the LUT circuit. In this case, writing is not performed on the memory elements connected to the SRAM cells $\mathbf{35}_1$ through $\mathbf{35}_n$, and these memory elements remain in a high-resistance state. With this, the logical value of the LUT circuit is made nonvolatile, and, even if the power supply is cut off, the logical value of the power supply potential VDD or the ground potential VSS can be instantaneously output from the MUX circuit 220. That is, power consumption can be reduced.

(LUT-RAM Operation)

Figure 9:
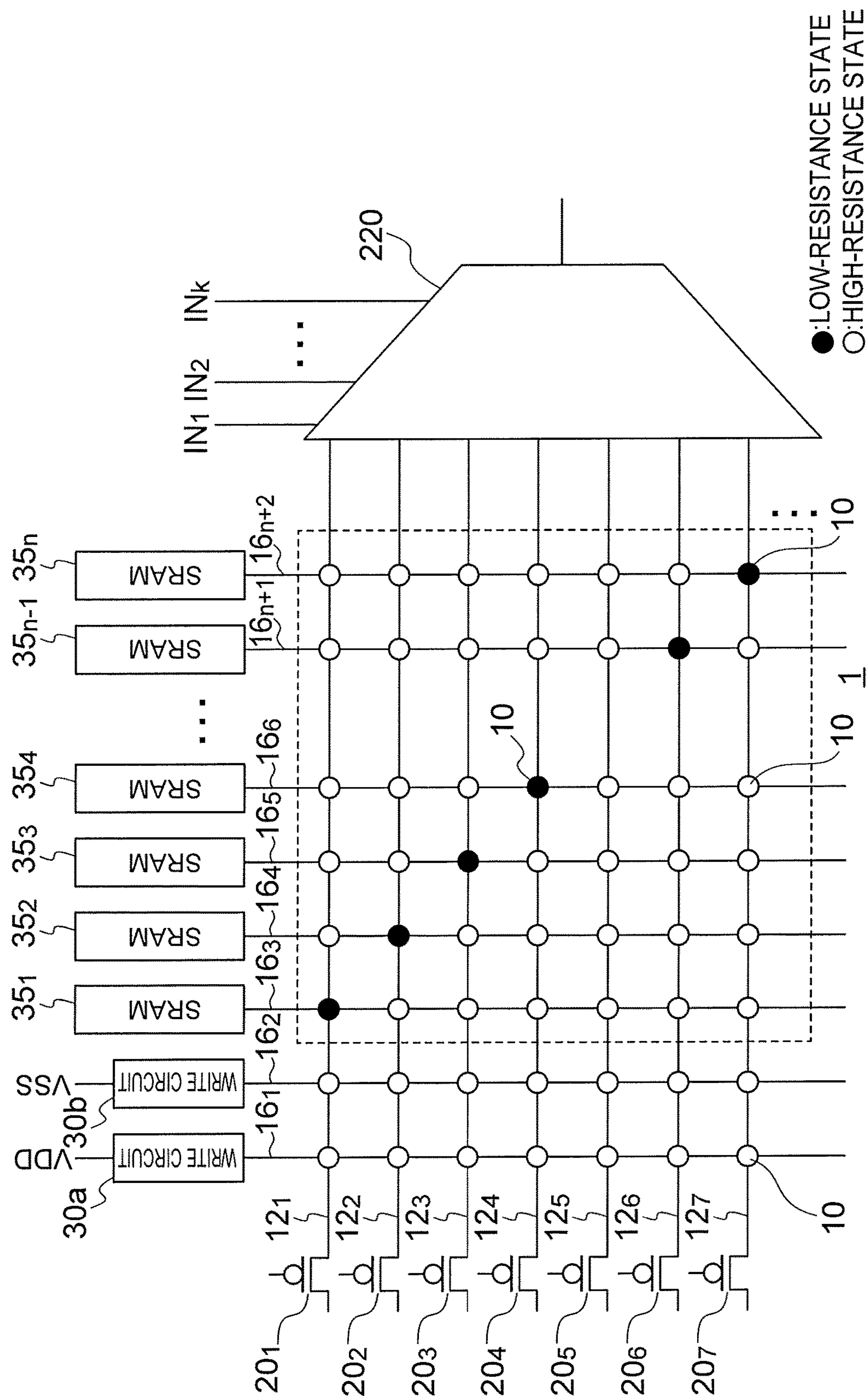
FIG. 9 is a diagram for explaining an LUT-RAM operation in the first embodiment.

Referring now to FIG. 9, a case where the semiconductor integrated circuit (LUT circuit) of the first embodiment is used as an LUT-RAM is described.

In a case where the LUT circuit of the first embodiment is used as an LUT-RAM, writing is performed on memory elements 10 connected to the column wiring lines $\mathbf{16}_3$ through $\mathbf{16}_{n+2}$ corresponding to the SRAM cells $\mathbf{35}_1$ through $\mathbf{35}_n$. For example, as shown in FIG. 9, on the column wiring line $\mathbf{16}_3$, writing is performed on the memory element 10 connected to the column wiring line $\mathbf{16}_3$ and the row wiring line $\mathbf{12}_1$, so that this memory element 10 is put into a low-resistance state. Likewise, on the column wiring line $\mathbf{16}_4$, writing is performed on the memory element 10 connected to the column wiring line $\mathbf{16}_4$ and the row wiring line $\mathbf{12}_2$, so that this memory element 10 is put into a low-resistance state. In FIG. 9, writing is performed on one of the memory elements connected to one column wiring line. However, writing may be performed on two or more memory elements connected to one column wiring line. In this case, writing can be performed on only one memory element among the memory elements connected to the same row wiring line. Meanwhile, writing is not performed on the memory elements connected to the column wiring lines $\mathbf{16}_1$ and $\mathbf{16}_2$ corresponding to the write circuits 30*a* and 30*b*, so that these memory elements 10 remain in a high-resistance state.

With this configuration, SRAM cells can be used in the LUT circuit. Thus, the LUT circuit can be used as an LUT-RAM. That is, high-speed writing and reading becomes possible.

As described above, the first embodiment can providea semiconductor integrated circuit that consumes lower amounts of power and is capable of high-speed writing and reading.

(Second Embodiment)

Figure 10:
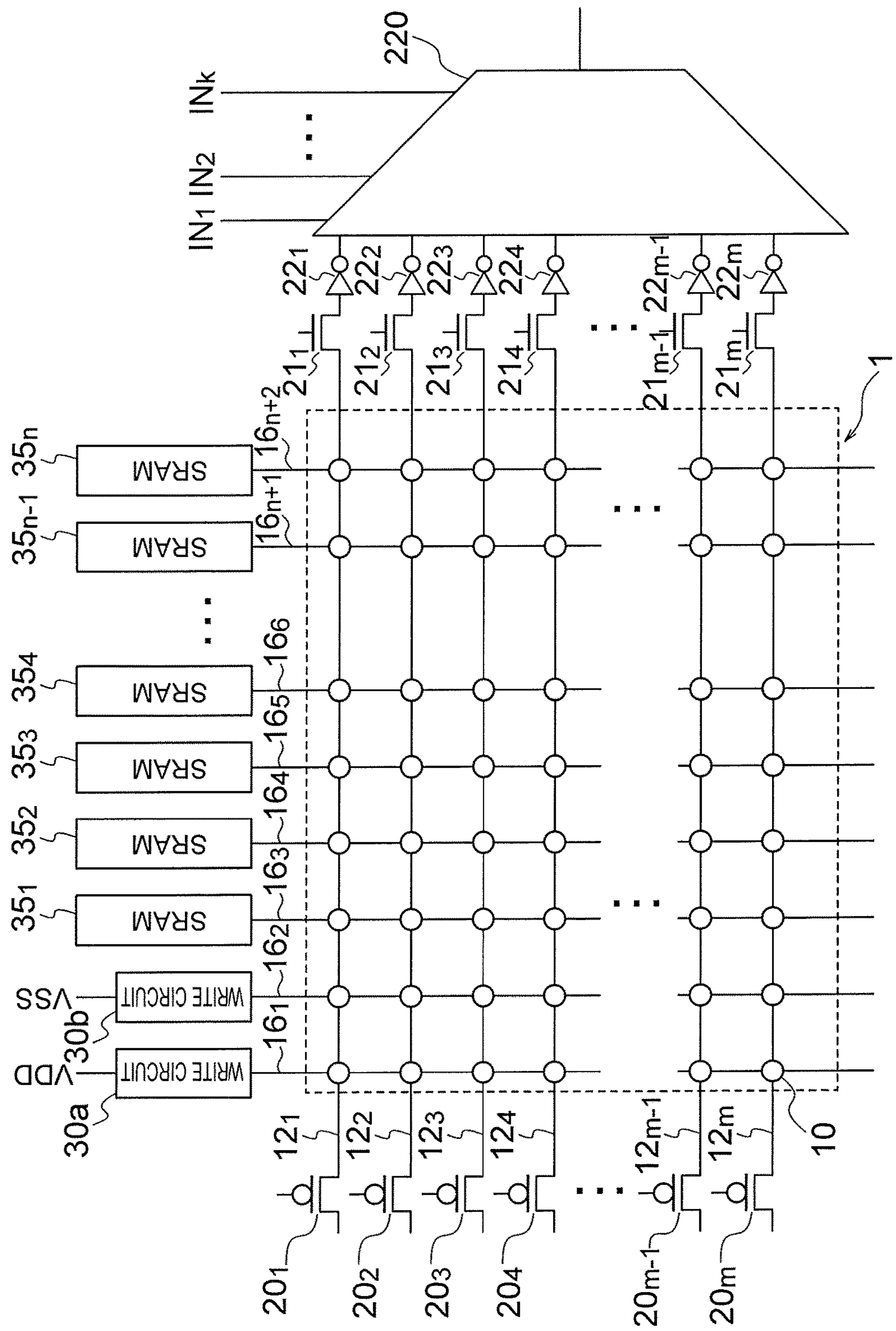
FIG. 10 is a diagram showing a semiconductor integrated circuit according to a second embodiment.

FIG. 10 shows a semiconductor integrated circuit according to a second embodiment. The semiconductor integrated circuit of the second embodiment is the same as the semiconductor integrated circuit (LUT circuit) of the first embodiment shown in FIG. 4, except that a protection transistor $\mathbf{21}_i$ (i=1, . . . m) and an inverter $\mathbf{22}_i$ are provided between each row wiring line $\mathbf{12}_i$ of the crossbar array 1 and the input terminal of the MUX circuit 220 corresponding to this row wiring line $\mathbf{12}_i$. One of the source and the drain of each protection transistor $\mathbf{21}_i$ (i=1, . . . m) is connected to the corresponding row wiring line $\mathbf{12}_i$, the other one of the source and the drain is connected to the input terminal of the corresponding inverter $\mathbf{22}_i$, and the protection transistor $\mathbf{21}_i$, receives a control signal at its gate. Each inverter $\mathbf{22}_i$, (i=1, . . . m) is connected to the input terminal of the MUX 220 corresponding to its output terminal.

In a case where the drive power is insufficient to directly drive the MUX circuit 220 from the writing circuits 30$a$, 30$b$ and the SRAM cells $\mathbf{35}_1$ through $\mathbf{35}_n$ via the crossbar array 1 in the first embodiment shown in FIG. 4, the inverters $\mathbf{22}_1$ through $\mathbf{22}_m$ may be inserted between the crossbar array 1 and the MUX circuit 220 to amplify signals as in the second embodiment shown in FIG. 10. In that case, the transistors $\mathbf{21}_1$ through $\mathbf{21}_m$ are inserted as protective elements in series between the crossbar array 1 and inverters $\mathbf{22}_1$ through $\mathbf{22}_m$ so that the inverters are not broken by the memory write potential Vprog.

The power supply potential VDD or a lower potential than the write potential Vprog is applied to the gate terminals of the protection transistors $\mathbf{21}_1$ through $\mathbf{21}_m$. In this manner, the drive force for the MUX circuit 220 can be obtained via the crossbar array 1. In a case where the MUX circuit 220 is formed on the basis of the CMOS logic, it is also possible to insert protection elements without the inverters $\mathbf{22}_1$ through $\mathbf{22}_m$.

Like the first embodiment, the second embodiment also enables an LUT-RAM operation as well as a nonvolatile LUT operation. Thus, like the first embodiment, the second embodiment can also provide a semiconductor integrated circuit that consumes lower amounts of power and is capable of high-speed writing and reading.

(Third Embodiment)

Figure 11:
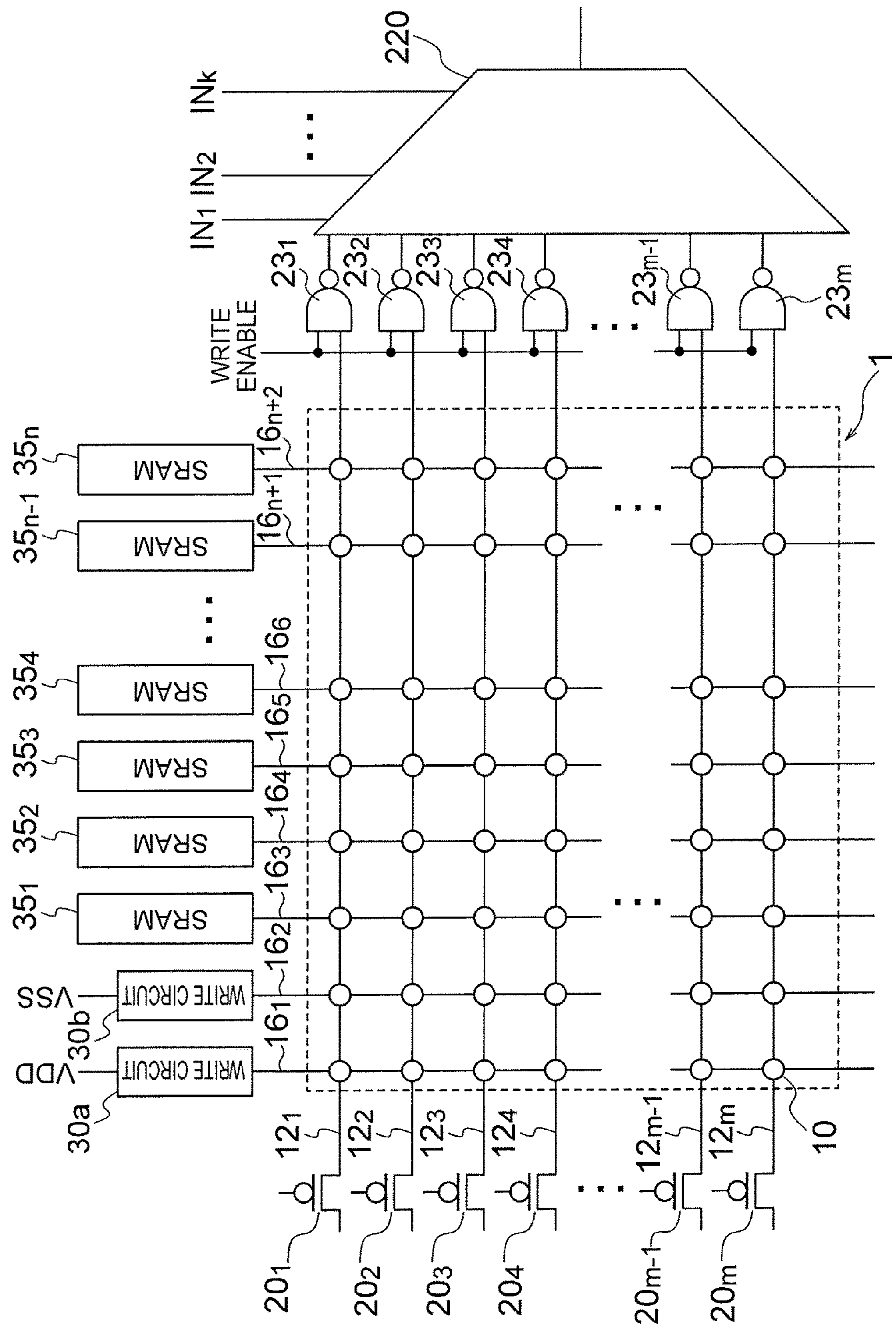
FIG. 11 is a diagram showing a semiconductor integrated circuit according to a third embodiment.

FIG. 11 shows a semiconductor integrated circuit according to a third embodiment. The semiconductor integrated circuit of the third embodiment is the same as the semiconductor integrated circuit (LUT circuit) of the first embodiment shown in FIG. 4, except that a NAND gate $\mathbf{23}_i$ (i=1, . . . m) is provided between each row wiring line $\mathbf{12}_i$ of the crossbar array 1 and the input terminal of the MUX circuit 220 corresponding to this row wiring line $\mathbf{12}_i$. The row wiring line $\mathbf{12}_i$ corresponding to one input terminal is connected to each NAND gate $\mathbf{23}_i$ (i=1, . . . m), an enable signal is input to the other input terminal.

In a case where the drive force is insufficient to directly drive the MUX circuit 220 from the output terminals of the crossbar array 1, each signal is amplified by the corresponding NAND gate $\mathbf{23}_i$ (i=1, . . . m). Further, each NAND gate $\mathbf{23}_i$ (i=1, . . . m) protects the MUX circuit 220 from the high voltage at a time of writing on a memory element 10.

Figure 12:
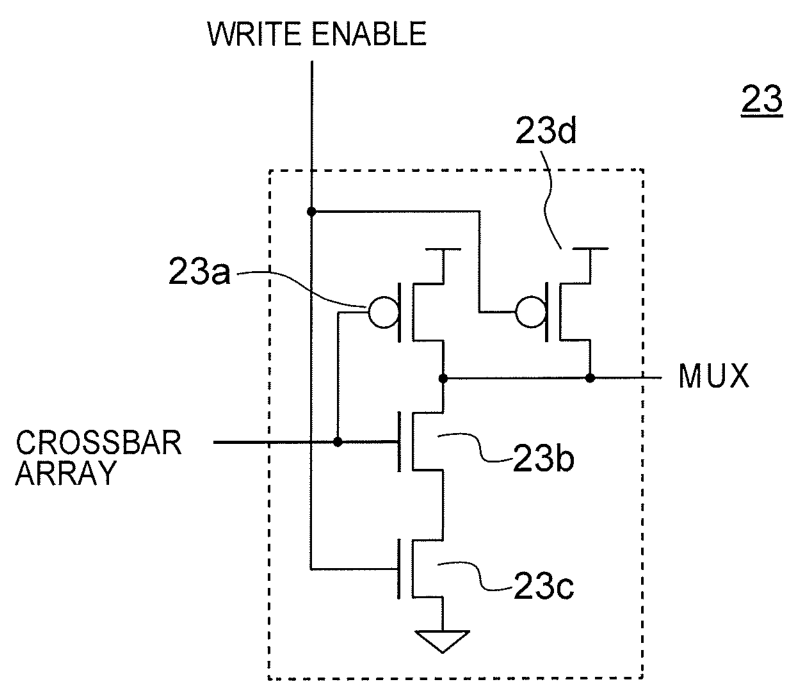
FIG. 12 is a circuit diagram showing a specific example of a NAND gate.

FIG. 12 shows a specific example of a NAND gate $\mathbf{23}_i$ (i =1, . . . m). The NAND gate 23 of this specific example includes a p-channel transistor 23$a$, an n-channel transistor 23$b$, an n-channel transistor 23$c$, and a p-channel transistor 23$d$. The transistor 23$a$, the transistor 23$b$, and the transistor 23$c$ are connected in series. The gates of the transistors 23$a$ and 23$b$ are connected to the corresponding row wiring line of the crossbar array 1, and the drains of the transistors 23$a$ and 23$b$ are connected to the corresponding input terminal of the MUX circuit 220. The gate of the transistor 23$c$ and the gate of the transistor 23$d$ receive a write enable signal. The drain of the transistor 23$d$ is connected to the corresponding input terminal of the MUX circuit 220. That is, the write enable signal is connected to the gate terminal of one p-channel transistor 23$d$ of the NAND gate 23 and the gate terminal of the n-channel transistor 23$c$ on the side closer to the VSS power supply.

When writing is performed on a memory element 10, the VSS potential is applied to the write enable signal, the one p-channel transistor 23$d$ is turned on, and the n-channel transistor 23$c$ located closer to the power supply is turned off. As a result, the potentials of the sources, the drains, and the channels of the transistors 23$a$ and 23$b$ to which the crossbar array 1 is connected become the power supply potential VDD, and, even if a high write voltage is applied from the crossbar array 1, the transistors are protected by the power supply potential VDD.

During an FPGA operation, the write enable signal is set to the power supply potential VDD. In a case where the NAND gates $\mathbf{23}_i$ (i=1, . . . , m) are used, the number of necessary transistors becomes larger than that in a case where protection transistors and inverters are used as in the second embodiment, but the voltage to be used can be advantageously obtained as a logical voltage of the power supply potential VDD and the ground potential VSS. Thus, the drive force for the MUX circuit 220 can be obtained via the crossbar array 1, without degradation of the circuit. It should be noted that the MUX circuit 220 can also be formed by using the NAND gates as the input circuits for the MUX circuit 220.

Like the first embodiment, the third embodiment also enables an LUT-RAM operation as well as a nonvolatile LUT operation. Thus, like the first embodiment, the third embodiment can also provide a semiconductor integrated circuit that consumes lower amounts of power and is capable of high-speed writing and reading.

(Fourth Embodiment)

Figure 13:
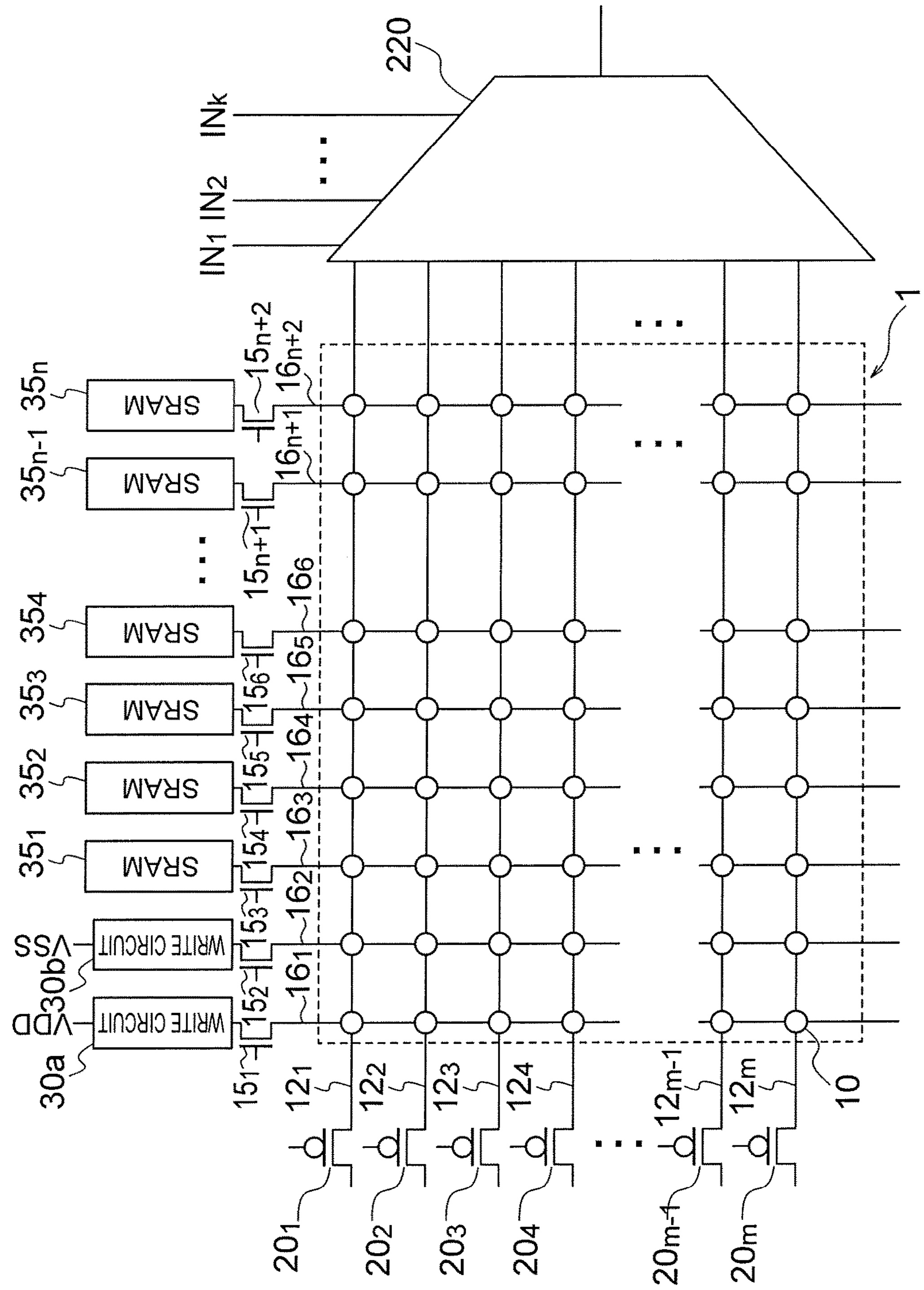
FIG. 13 is a diagram showing a semiconductor integrated circuit according to a fourth embodiment.

FIG. 13 shows a semiconductor integrated circuit according to a fourth embodiment. The semiconductor integrated circuit of the fourth embodiment is the same as the semiconductor integrated circuit (LUT circuit) of the first embodiment shown in FIG. 4, except that protection transistors $\mathbf{15}_1$ and $\mathbf{15}_2$ are provided between the write circuits 30$a$ and 30$b$ and the corresponding column wiring lines $\mathbf{16}_1$ and $\mathbf{16}_2$, and a protection transistor $\mathbf{15}_{j+2}$ is provided between each SRAM cell $\mathbf{35}_j$ (j=1, . . . , n) and the corresponding column wiring line $\mathbf{16}_{j+2}$.

Although a high voltage is applied to a memory element 10 to perform writing on the memory element 10, the write voltage is applied directly to the write circuits 30$a$ and 30$b$ and the SRAM cells $\mathbf{35}_1$ through $\mathbf{35}_n$ when the memory element 10 is switched from an ON-state to an OFF-state, or during a short period of time immediately after the memory element 10 is switched from an OFF-state to an OFF-state. In that case, to reduce damage to the write circuits 30$a$ and 30$b$ and the SRAM cells $\mathbf{35}_1$ through $\mathbf{35}_n$, the protection transistors $\mathbf{15}_j$ (j=1, . . . , (n+2)) are inserted in series so that the write circuits 30$a$ and 30$b$, and the SRAM cells $\mathbf{35}_1$ through $\mathbf{35}_n$ can be protected. The power supply potential VDD or a lower potential than the write potential Vprog is applied to the gate terminal of each protection transistor.

Like the first embodiment, the fourth embodiment also enables an LUT-RAM operation as well as a nonvolatile LUT operation. Thus, like the first embodiment, the fourth embodiment can also provide a semiconductor integrated circuit that consumes lower amounts of power and is capable of high-speed writing and reading.

(Fifth Embodiment)

Figure 14:
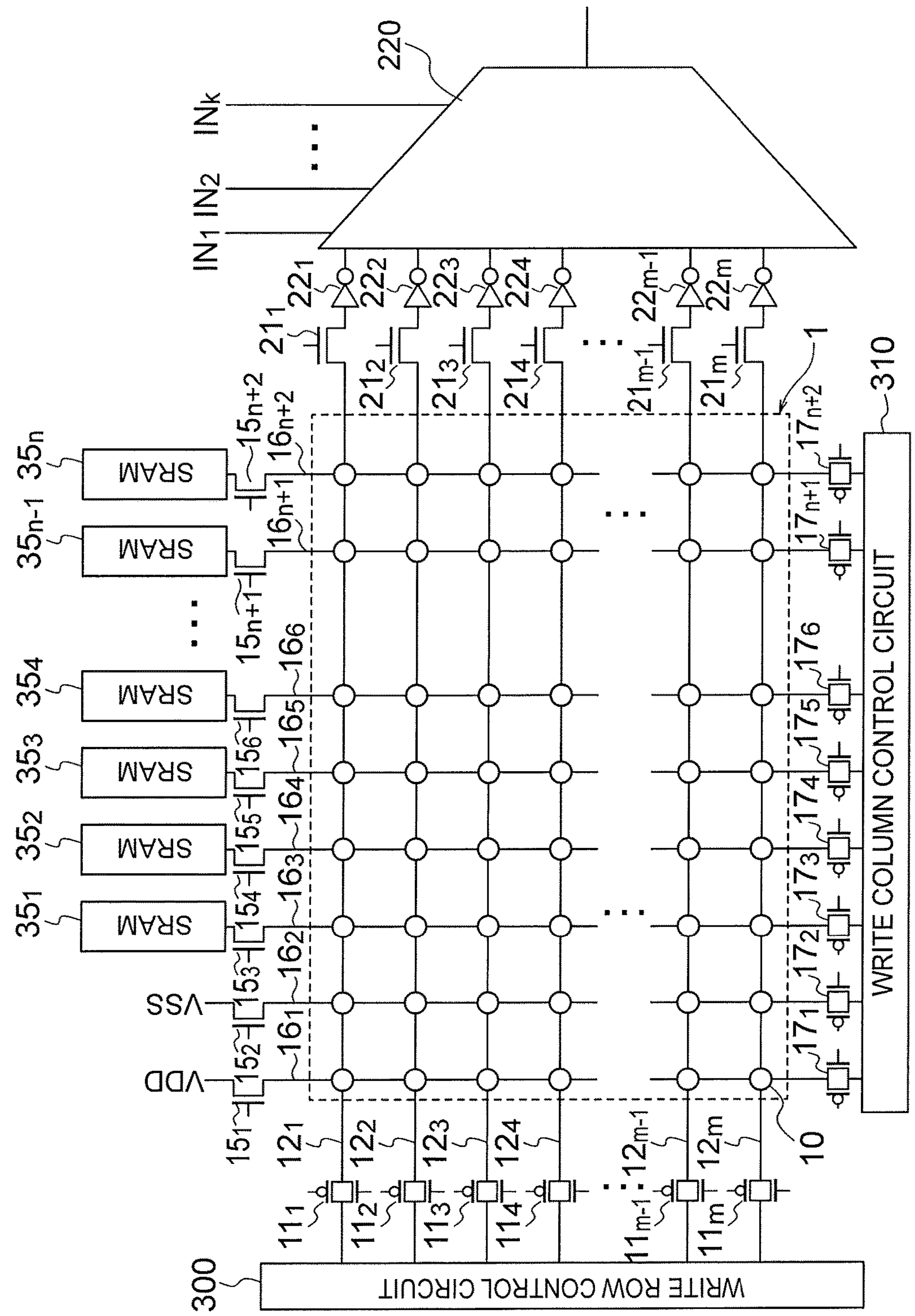
FIG. 14 is a diagram showing a semiconductor integrated circuit according to a fifth embodiment.

FIG. 14 shows a semiconductor integrated circuit according to a fifth embodiment. The semiconductor integrated circuit of the fifth embodiment is the same as the semiconductor integrated circuit (LUT circuit) of the second embodiment shown in FIG. 10, except that the write transistors $\mathbf{20}_1$ through $\mathbf{20}_m$ and the write circuits 30$a$ and 30$b$ are eliminated, and a write row control circuit 300, a write column control circuit 310, protection transistors $\mathbf{15}_1$ through $\mathbf{15}_{n+2}$, transfer gates $\mathbf{11}_1$ through $\mathbf{11}_m$, and transfer gates $\mathbf{17}_1$ through $\mathbf{17}_{n+2}$ are newly provided.

The protection transistor $\mathbf{15}_1$ is provided instead of the write circuit 30$a$, one of the source and the drain thereof is connected to the power supply potential VDD, and the other is connected to the corresponding column wiring line $\mathbf{16}_1$. The protection transistor $\mathbf{15}_2$ is provided instead of the write circuit 30*b*, one of the source and the drain thereof is connected to the ground potential VSS, and the other is connected to the corresponding column wiring line $\mathbf{16}_2$. Further, each protection transistor $\mathbf{15}_{j+2}$ (j=1, . . . , n) is disposed between the SRAM cell $\mathbf{35}_j$ and the corresponding column wiring line $\mathbf{16}_{j+2}$.

Each transfer gate $\mathbf{11}_i$ (i=1, . . . , m) is disposed between the write row control circuit 300 and the corresponding row wiring line $\mathbf{12}_j$. Each transfer gate $\mathbf{17}_j$ (j=1, . . . , (n+2)) is disposed between the write column control circuit 310 and the corresponding column wiring line $\mathbf{16}_i$.

The write row control circuit 300 selects the memory cell 10 on which writing is to be performed from the crossbar array 1 via the corresponding transfer gate $\mathbf{11}_i$ (i=1, . . . , m). The write column control circuit 310 selects the memory cell 10 on which writing is to be performed from the crossbar array 1 via the corresponding transfer gate $\mathbf{17}_i$ (j=1, . . . , (n+2)).

In the fifth embodiment having the above configuration, the transistors $\mathbf{15}_1$ through $\mathbf{15}_{n+2}$ are put into an OFF-state when writing is performed on a memory element 10, and the writing on the memory element 10 is performed by applying current between the write row control circuit 300 and the write column control circuit 310. In this manner, damage to the SRAM cells $\mathbf{35}_1$ through $\mathbf{35}_n$ can be reduced. Further, in the fifth embodiment, even in a case where bipolar elements are used as the memory elements 10 or where complicated voltage and current control is required, the circuit can operate with the design of a write control circuit.

Like the second embodiment, the fifth embodiment also enables an LUT-RAM operation as well as a nonvolatile LUT operation. Thus, like the second embodiment, the fifth embodiment can also provide a semiconductor integrated circuit that consumes lower amounts of power and is capable of high-speed writing and reading.

(Sixth Embodiment)

Figure 15:
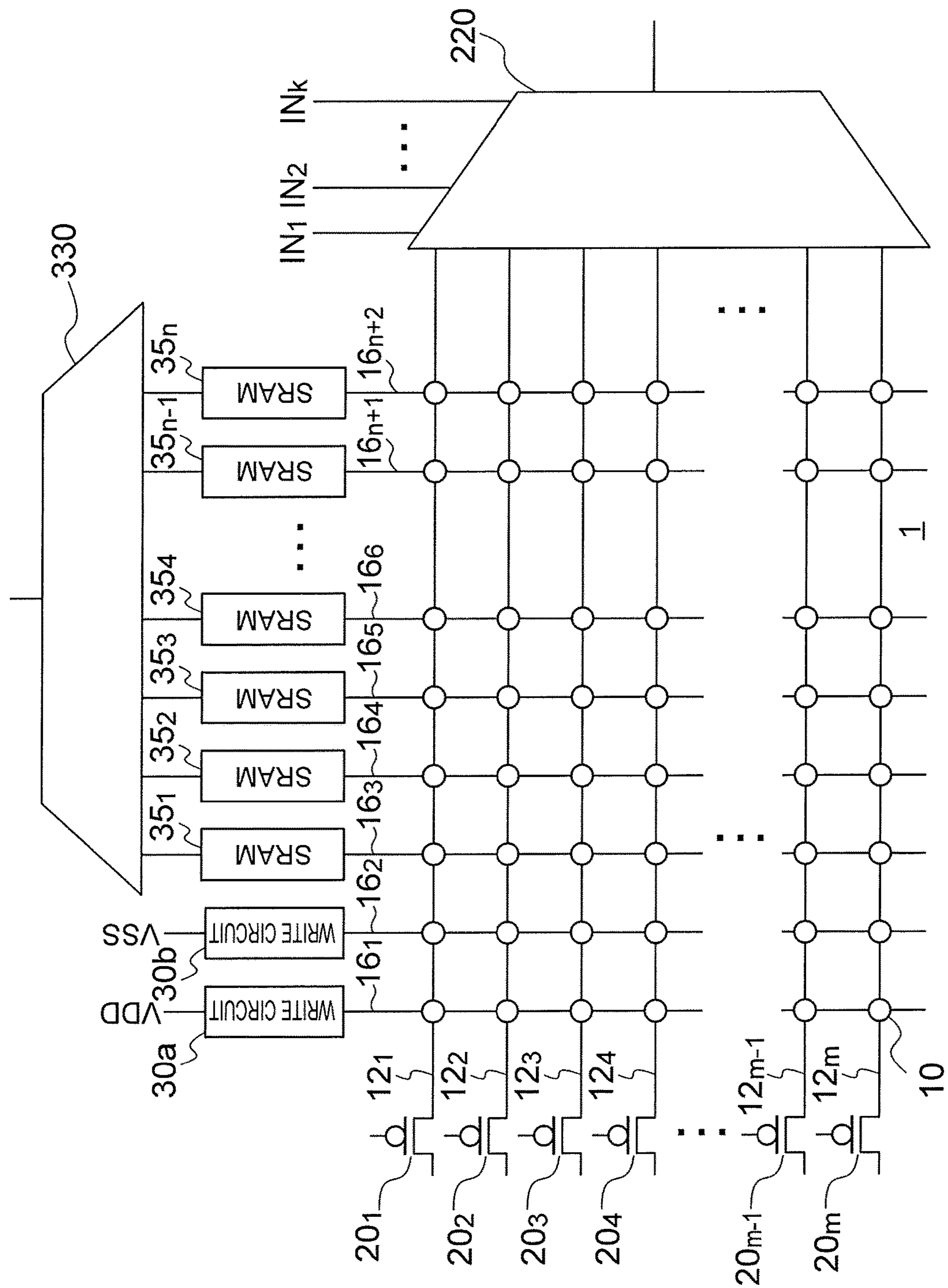
FIG. 15 is a diagram showing a semiconductor integrated circuit according to a sixth embodiment.

FIG. 15 shows a semiconductor integrated circuit according to a sixth embodiment. The semiconductor integrated circuit of the sixth embodiment is the same as the semiconductor integrated circuit (LUT circuit) of the first embodiment shown in FIG. 4, except that a demultiplexor circuit 330 is newly provided on the opposite side of the SRAM cells $\mathbf{35}_1$ through $\mathbf{35}_n$ from the crossbar array 1.

With such a configuration, data writing can be performed on the SRAM cells $\mathbf{35}_1$ through $\mathbf{35}_n$ independently of the semiconductor integrated circuit (LUT circuit) of the sixth embodiment. FIG. 15 shows an example of the demultiplexor circuit 330 connected to the SRAM cells $\mathbf{35}_1$ through $\mathbf{35}_n$. Instead of the single demultiplexor circuit 330, two or more demultiplexor circuits may be connected to the SRAM cells $\mathbf{35}_1$ through $\mathbf{35}_n$, to enable access to the LUT circuit with various signals. Further, the SRAM cells $\mathbf{35}_1$ through $\mathbf{35}_n$ may be divided into domains, and small demultiplexor circuits may be connected to the domains.

The sixth embodiment can also be applied to any of the second through fifth embodiments.

Like the first embodiment, the sixth embodiment also enables an LUT-RAM operation as well as a nonvolatile LUT operation. Thus, like the first embodiment, the sixth embodiment can also provide a semiconductor integrated circuit that consumes lower amounts of power and is capable of high-speed writing and reading.

(Seventh Embodiment)

Figure 16:
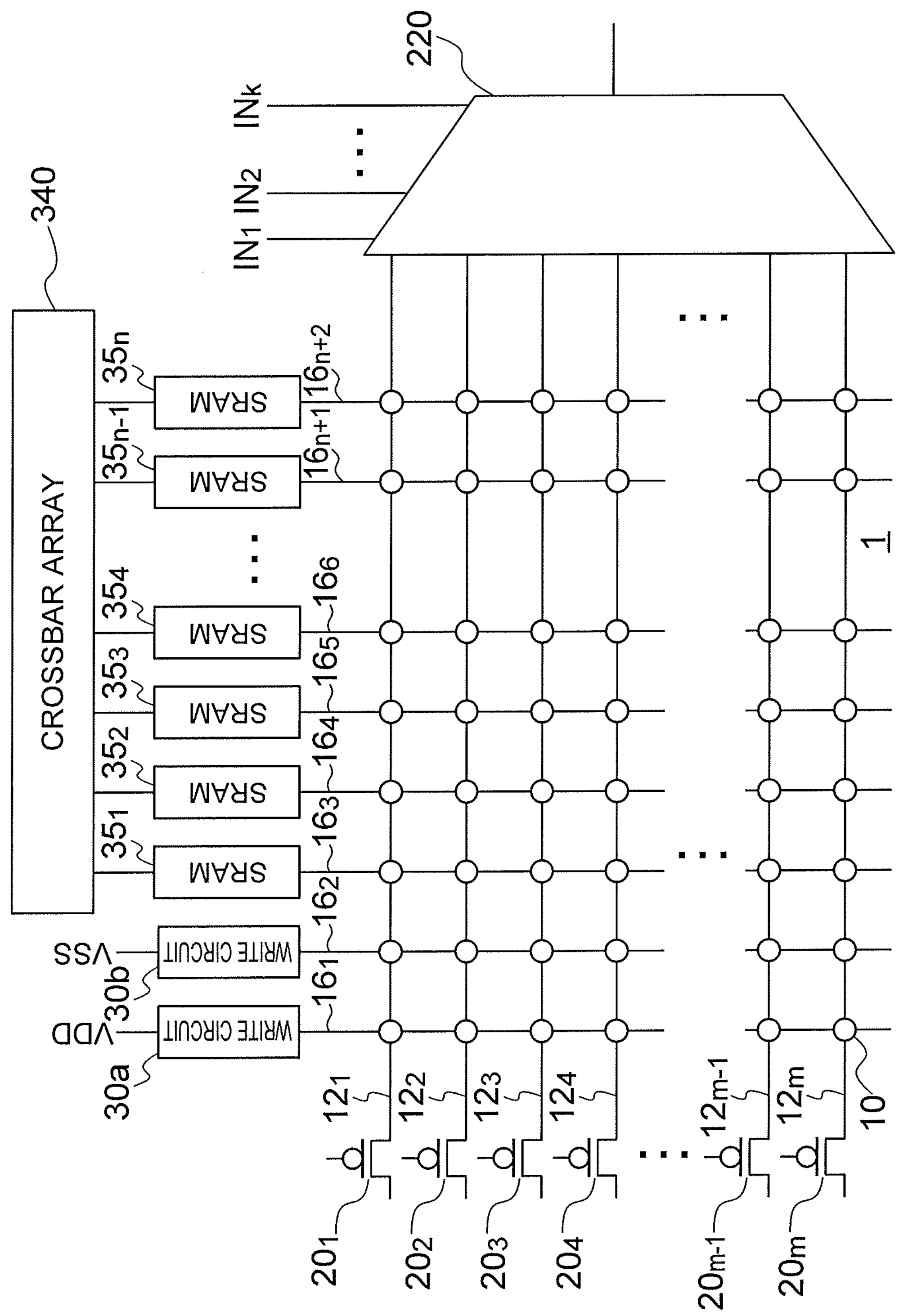
FIG. 16 is a diagram showing a semiconductor integrated circuit according to a seventh embodiment.

FIG. 16 shows a semiconductor integrated circuit according to a seventh embodiment. The semiconductor integrated circuit of the seventh embodiment is the same as the semiconductor integrated circuit (LUT circuit) of the sixth embodiment shown in FIG. 15, except that the demultiplexor circuit 330 is replaced with a crossbar array 340. Like the crossbar array 1, the crossbar array 340 includes row wiring lines (not shown), column wiring lines (not shown) three-dimensionally intersecting with the respective row wiring lines, and two-terminal memory elements (not shown) disposed in the cross regions between the respective wiring lines and the respective column wiring lines. One terminal of each memory element is connected to the corresponding row wiring line, and the other terminal is connected to the corresponding column wiring line.

With such a configuration, data writing can be performed on the SRAM cells $\mathbf{35}_1$ through $\mathbf{35}_n$ independently of the semiconductor integrated circuit (LUT circuit) of the seventh embodiment. The crossbar array 340 can also be regarded as a multi-input multi-output MUX circuit. Instead of a multi-input multi-output MUX circuit, a large number of MUX circuits and small MUX circuits can be employed. However, the area of the LUT circuit of the seventh embodiment is smaller, because only a single crossbar array is added.

The seventh embodiment can be applied to any of the second through fifth embodiments.

Like the sixth embodiment, the seventh embodiment also enables an LUT-RAM operation as well as a nonvolatile LUT operation. Thus, like the sixth embodiment, the seventh embodiment can also provide a semiconductor integrated circuit that consumes lower amounts of power and is capable of high-speed writing and reading.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:

first wiring lines;

at least two second wiring lines intersecting with the first wiring lines;

third wiring lines intersecting with the first wiring lines;

first memory elements disposed in a cross region between the first wiring lines and the second wiring lines, at least one of the first memory elements including a first terminal connected to corresponding one of the first wiring lines and a second terminal connected to corresponding one of the second wiring lines;

second memory elements disposed in a cross region between the first wiring lines and the third wiring lines, at least one of the second memory elements including a third terminal connected to corresponding one of the first wiring lines and a fourth terminal connected to corresponding one of the third wiring lines;

a first write control circuit connected to the first wiring lines;

a first circuit connected to one of the second wiring lines, the first circuit supplying a first potential;

a second circuit connected to the other one of the second wiring lines, the second circuit supplying a second potential lower than the first potential;

SRAM cells disposed to correspond to the third wiring lines, and at least one of the SRAM cells being connected to corresponding one of the third wiring lines; and a selection circuit including input terminals corresponding to the first wiring lines and an output terminal, each of the input terminals being electrically connected to corresponding one of the first wiring lines, the selection circuit connecting one of the input terminals to the output terminal in accordance with an input signal.

2. The semiconductor integrated circuit according to claim 1, wherein the first circuit includes:

a first transistor including a source, a drain, and a gate, one of the source and the drain being connected to the first potential, the gate receiving a cutoff signal;

a second transistor including a source, a drain, and a gate, one of the source and the drain being connected to the first potential, the gate receiving an enable signal;

a third transistor including a source, a drain, and a gate, one of the source and the drain being connected to the other one of the source and the drain of the second transistor, the gate being connected to a fourth wiring line;

a fourth transistor including a source, a drain, and a gate, one of the source and the drain being connected to the other one of the source and the drain of the third transistor, the gate being connected to the fourth wiring line, the other one of the source and the drain being connected to the second potential;

a first inverter including an input terminal and an output terminal, the input terminal being connected to the other one of the source and the drain of the first transistor, the other one of the source and the drain of the third transistor, and the one of the source and the drain of the fourth transistor, the output terminal being connected to the one of the second wiring lines, and the second circuit includes:

a fifth transistor including a source, a drain, and a gate, one of the source and the drain being connected to the second potential, the gate receiving a cutoff signal;

a sixth transistor including a source, a drain, and a gate, one of the source and the drain being connected to the first potential, the gate receiving an enable signal;

a seventh transistor including a source, a drain, and a gate, one of the source and the drain being connected to the other one of the source and the drain of the sixth transistor, the gate being connected to a fifth wiring line;

an eighth transistor including a source, a drain, and a gate, one of the source and the drain being connected to the other one of the source and the drain of the seventh transistor, the gate being connected to the fifth wiring line, the other one of the source and the drain being connected to the second potential; and a second inverter including an input terminal and an output terminal, the input terminal being connected to the other one of the source and the drain of the fifth transistor, the other one of the source and the drain of the seventh transistor, and the one of the source and the drain of the eighth transistor, the output terminal being connected to the other one of the second wiring lines.

3. The semiconductor integrated circuit according to claim 1, wherein the first circuit includes:

a first transfer gate including an input terminal connected to a fourth wiring line; a second transfer gate including an input terminal connected to the first potential; and a first inverter including an input terminal and an output terminal, the input terminal being connected to an output terminal of each of the first and second transfer gates, the output terminal being connected to the one of the second wiring lines, a gate of an n-channel transistor of the first transfer gate and a gate of a p-channel transistor of the second transfer gate receiving an enable signal, a gate of a p-channel transistor of the first transfer gate and a gate of an n-channel transistor of the second transfer gate receiving an inverted signal of the enable signal, and the second circuit includes:

a third transfer gate including an input terminal connected to a fifth wiring line; a fourth transfer gate including an input terminal connected to the second potential; and a second inverter including an input terminal and an output terminal, the input terminal being connected to an output terminal of each of the third and fourth transfer gates, the output terminal being connected to the other one of the second wiring lines, a gate of an n-channel transistor of the third transfer gate and a gate of a p-channel transistor of the fourth transfer gate receiving an enable signal, a gate of a p-channel transistor of the third transfer gate and a gate of an n-channel transistor of the fourth transfer gate receiving an inverted signal of the enable signal.

4. The semiconductor integrated circuit according to claim 1, further comprising:

first protection transistors disposed between the first wiring lines and the input terminals of the selection circuit, the first protection transistors each including a source and a drain, one of the source and the drain being connected to corresponding one of the first wiring lines; and inverter circuits disposed between the first protection transistors and the input terminals of the selection circuit, the inverter circuits each including an input terminal and an output terminal, the input terminal being connected to the other one of the source and the drain of the first protection transistor, the output terminal being connected to corresponding one of the input terminals of the selection circuit.

5. The semiconductor integrated circuit according to claim 1, further comprising a NAND gate disposed between each of the first wiring lines and corresponding one of the input terminals of the selection circuit.

6. The semiconductor integrated circuit according to claim 1, further comprising: second protection transistors disposed between the second wiring lines and the first and second circuits; and third protection transistors disposed between the third wiring lines and the SRAM cells.

7. The semiconductor integrated circuit according to claim 1, wherein the first write control circuit includes write transistors corresponding to the first wiring lines.

8. The semiconductor integrated circuit according to claim 1, further comprising: a second write control circuit connected to the second wiring lines and the third wiring lines; a first transfer gate disposed between the first write control circuit and each of the first wiring lines; and a second transfer gate disposed between the second write control circuit and each of the second and third wiring lines, wherein the first circuit includes a second protection transistor including a source and a drain, one of the source and the drain being connected to the first potential, the other one of the source and the drain being connected to the corresponding one of the second wiring lines, and the second circuit includes a third protection transistor including a source and a drain, one of the source and the drain being connected to the second potential, the other one of the source and the drain being connected to the corresponding one of the second wiring lines.

9. The semiconductor integrated circuit according to claim 1, further comprising a demultiplexor circuit that sends write data to each of the SRAM cells.

10. The semiconductor integrated circuit according to claim 1, further comprising a crossbar array that sends write data to each of the SRAM cells.

11. The semiconductor integrated circuit according to claim 1, wherein the first memory elements are MOS transistors, the first terminal of one of the first memory elements being a gate of corresponding one of the MOS transistors while the second terminal is at least one of a source and a drain of the corresponding one of the MOS transistors, or being at least one of the source and the drain of the corresponding one of the MOS transistors while the second terminal is the gate of the corresponding one of the MOS transistors, and the second memory elements are MOS transistors, the third terminal of one of the second memory elements being a gate of corresponding one of the MOS transistors while the fourth terminal is at least one of a source and a drain of the corresponding one of the MOS transistors, or being at least one of the source and the drain of the corresponding one of the MOS transistors while the fourth terminal is the gate of the corresponding one of the MOS transistors.

12. The semiconductor integrated circuit according to claim 1, wherein the first and second memory elements are resistive change memory elements each including first and second electrodes, and a resistive change layer interposed between the first electrode and the second electrode.

* * * * *